(12) United States Patent
Hsieh et al.

(10) Patent No.: US 10,516,293 B2
(45) Date of Patent: Dec. 24, 2019

(54) UN-INTERRUPTIBLE POWER SUPPLY WITH INDICATION OF BATTERY INTERNAL RESISTANCE

(71) Applicant: CYBER POWER SYSTEMS INC., Taipei (TW)

(72) Inventors: Hung-Ming Hsieh, Taipei (TW); Yung-Hao Peng, Taipei (TW); Ta-Peng Chen, Taipei (TW)

(73) Assignee: CYBER POWER SYSTEMS INC., Taipei (TW)

( * ) Notice: Subject to any disclaimer, the term of this patent is extended or adjusted under 35 U.S.C. 154(b) by 0 days.

(21) Appl. No.: 16/231,593

(22) Filed: Dec. 23, 2018

(65) Prior Publication Data

US 2019/0131820 A1    May 2, 2019

Related U.S. Application Data

(63) Continuation of application No. 15/435,278, filed on Feb. 16, 2017, now Pat. No. 10,205,340.

(30) Foreign Application Priority Data

Jan. 3, 2017   (CN) .......................... 2017 1 0001628

(51) Int. Cl.
*H02J 9/00* (2006.01)
*H02J 7/00* (2006.01)
(Continued)

(52) U.S. Cl.
CPC .............. *H02J 9/00* (2013.01); *G01R 31/389* (2019.01); *G01R 31/396* (2019.01);
(Continued)

(58) Field of Classification Search
CPC ...... H02J 9/00; H02J 9/06; H02J 7/027; H02J 7/0021; G01R 31/396; G01R 31/389; H01M 10/48
See application file for complete search history.

(56) References Cited

U.S. PATENT DOCUMENTS

| | | | |
|---|---|---|---|
| 6,094,030 A | 7/2000 | Gunthorpe et al. | |
| 7,902,828 B2 | 3/2011 | Huang | |
| (Continued) | | | |

FOREIGN PATENT DOCUMENTS

CA    2448536 A1 * 12/2002    ................ H02J 9/06

*Primary Examiner* — Daniel J Cavallari
(74) *Attorney, Agent, or Firm* — Hershkovitz & Associates, PLLC; Abe Hershkovitz (57) ABSTRACT

An un-interruptible power supply (UPS) with indication of battery internal resistance includes a processor, a display, an internal resistance sensor assembly and a battery pack. The internal resistance sensor assembly is connected to the processor and the battery pack. The processor is connected to the display, generates a reference internal resistance according to multiple internal resistances detected by the internal resistance sensor assembly within a stable time after installation, generates a stable internal resistance according to an internal resistance of the battery pack detected by the internal resistance sensor assembly after the stable time, compares the stable internal resistance with the reference internal resistance to generate a status of internal resistance of the battery pack, and instructs the display to display the status for user's timely awareness of the condition of the battery pack and prompt action when the performance of the battery pack deteriorates.

20 Claims, 5 Drawing Sheets

(51) Int. Cl.
*G01R 31/389* (2019.01)
*H01M 10/48* (2006.01)
*G01R 31/396* (2019.01)
*H02J 7/02* (2016.01)
*H02J 9/06* (2006.01)

(52) U.S. Cl.
CPC .......... *H01M 10/48* (2013.01); *H02J 7/0021* (2013.01); *H02J 7/027* (2013.01); *H02J 9/06* (2013.01)

(56) References Cited

U.S. PATENT DOCUMENTS

2003/0231009 A1 12/2003 Nemoto
2013/0293995 A1* 11/2013 Brown ................ G01R 31/396
361/93.1

* cited by examiner

UN-INTERRUPTIBLE POWER SUPPLY WITH INDICATION OF BATTERY INTERNAL RESISTANCE

CROSS-REFERENCE TO RELATED APPLICATIONS

This application is a continuation application of U.S. application Ser. No. 15/435,278, filed on Feb. 16, 2017, the disclosures of which are incorporated herein in their entirety by reference.

BACKGROUND OF THE INVENTION

1. Field of the Invention

The present invention relates to an un-interruptible power supply (UPS) and, more particularly, to a UPS with indication of battery internal resistance.

2. Description of the Related Art

Modern people use computers to handle information at work and in daily life or use servers to process network information exchange. Hence, it is crucial to keep computer and servers operating under a stable condition. To prevent loss arising from unexpected shutdown of computers and servers during mains power failure, conventionally, UPSs are provided to supply short-term power to computers and servers for storing data generated in operation and avoiding any form of loss out of missing information during mains power failure. Speaking of development of UPS, battery may be a current focus of UPS development.

As disclosed in U.S. Pat. No. 6,094,030 (hereinafter GUNTHORPE), internal resistance and capacity of a backup battery pack are monitored. The internal resistance of each battery of the backup battery pack is detected and is transmitted to a remote server for calculation to determine status of the internal resistance of each battery. Frequency of charging each battery can be independently adjusted to prevent the battery from being over-charged. However, GUNTHORPE can only adjust the battery-charging frequency for battery overcharge avoidance without providing any kind of alarm and report, making users unaware of current condition of the batteries.

As disclosed in U.S. Pat. No. 7,902,828 (hereinafter HUANG), a warning method for monitoring battery performance according to internal resistance of power supply includes coupling a first power transistor as or as part of a first external load in series with the battery, coupling a second power transistor as or as part of a second external load in series with the battery, and repeatedly conducting each power transistor to draw a transient large current from the battery while sampling the voltage across the battery and voltage across the load, from which the internal resistance of the battery can be determined. The internal resistance of the battery can then be compared with a predetermined nominal value to issue a warning if the battery is weak.

Although HUANG can determine if the battery is good for operation, the transient large current must be repeatedly acquired and such necessity requires battery to be discharged a couple of times, which in turn deteriorates battery performance. Structural complication also arises from the additionally equipped first power transistor, first external resistor, second power transistor and second external resistor. Additionally, the predetermined nominal value is configured based on type of battery, and under the circumstance of unstable battery operation, the comparison between the internal resistance and the predetermined nominal value easily leads to an incorrect determination result.

SUMMARY OF THE INVENTION

An objective of the present invention is to provide an un-interruptible power supply (UPS) with indication of battery internal resistance, which generates a reliable reference internal resistance with multiple internal resistances measured within a stable time after installation and displays status of internal resistance of a battery pack after operation of the UPS for user's awareness and attention to the condition of the battery pack.

To achieve the foregoing objective, the UPS with indication of battery internal resistance includes an AC power input port, a battery charger, a DC to AC converter, a switch, a processor, a display, a battery pack and an internal resistance sensor assembly.

The AC power input port is adapted to connect to an AC power source.

The battery charger is connected to the AC power input port.

The DC to AC converter connected to the battery charger.

The switch has a first end, a second end and a switching end.

The first end is connected to the AC power input port.

The second end is connected to the DC to AC converter.

The switching end is switched by the switch to connect to one of the first end and the second end according to a control command received by the switch.

The processor has multiple input terminals and multiple output terminals, and transmits the control command to the switch when receiving an AC-sensed signal. A part of the multiple output terminals of the processor are connected to the switch, and a part of the multiple input terminals of the processor are connected to the AC power input port.

The display is connected to one of the output terminals of the processor and displays text-based information or displays status information with a background color of the display.

The battery pack is connected to the battery charger and the DC to AC converter, supplies a DC power, and is charged by the battery charger.

The internal resistance sensor assembly is connected to the battery pack and the processor to sense an internal resistance of the battery pack and transmit the internal resistance to the processor.

The processor generates a reference internal resistance according to multiple internal resistances of the battery pack detected within a stable time after installation of the battery pack, generates a stable internal resistance when an internal resistance is detected by the internal resistance sensor assembly after the stable time expires, and compares the stable internal resistance with the reference internal resistance to generate an internal resistance status for the display to display a status of internal resistance of the battery pack with text-based information and a corresponding background color.

From the foregoing description, the reference internal resistance of the battery pack is generated within the stable time after installation, operation of the battery pack becomes stable after the stable time expires, the processor then receives internal resistances detected by the internal resistance sensor assembly after the stable time to generate the stable internal resistance, compares the stable internal resistance with the reference internal resistance to generate a status of internal resistance of the battery pack, and instructs the display to display the status of internal resistance with text-based information or a corresponding background color. Accordingly, users can be aware of current status of internal resistance of the battery pack and take appropriate action to maintain reliable operation of the battery pack and the UPS.

Other objectives, advantages and novel features of the invention will become more apparent from the following detailed description when taken in conjunction with the accompanying drawings.

DETAILED DESCRIPTION OF THE INVENTION

Figure 1:
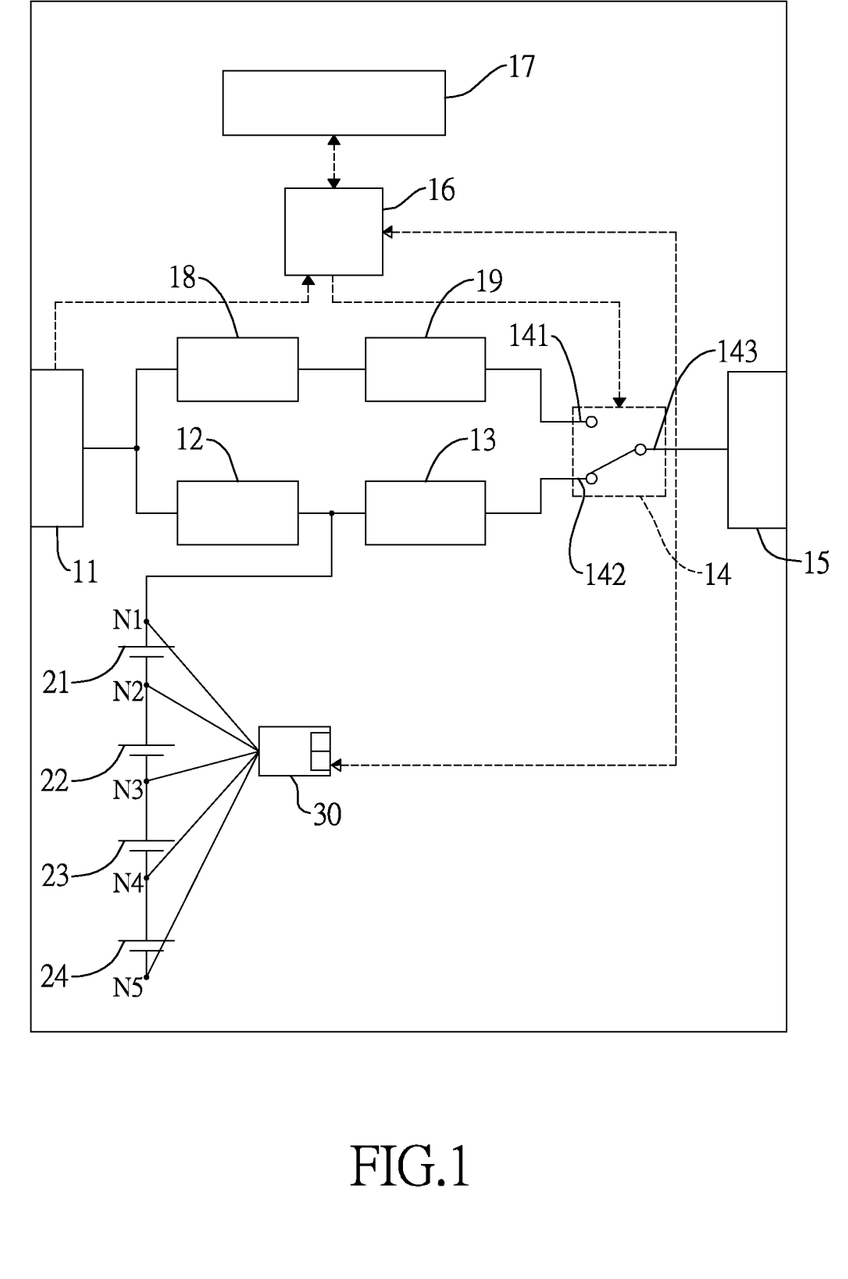
FIG. 1 is a functional block diagram of a first embodiment of a UPS with indication of battery internal resistance in accordance with the present invention.
Figure 2:
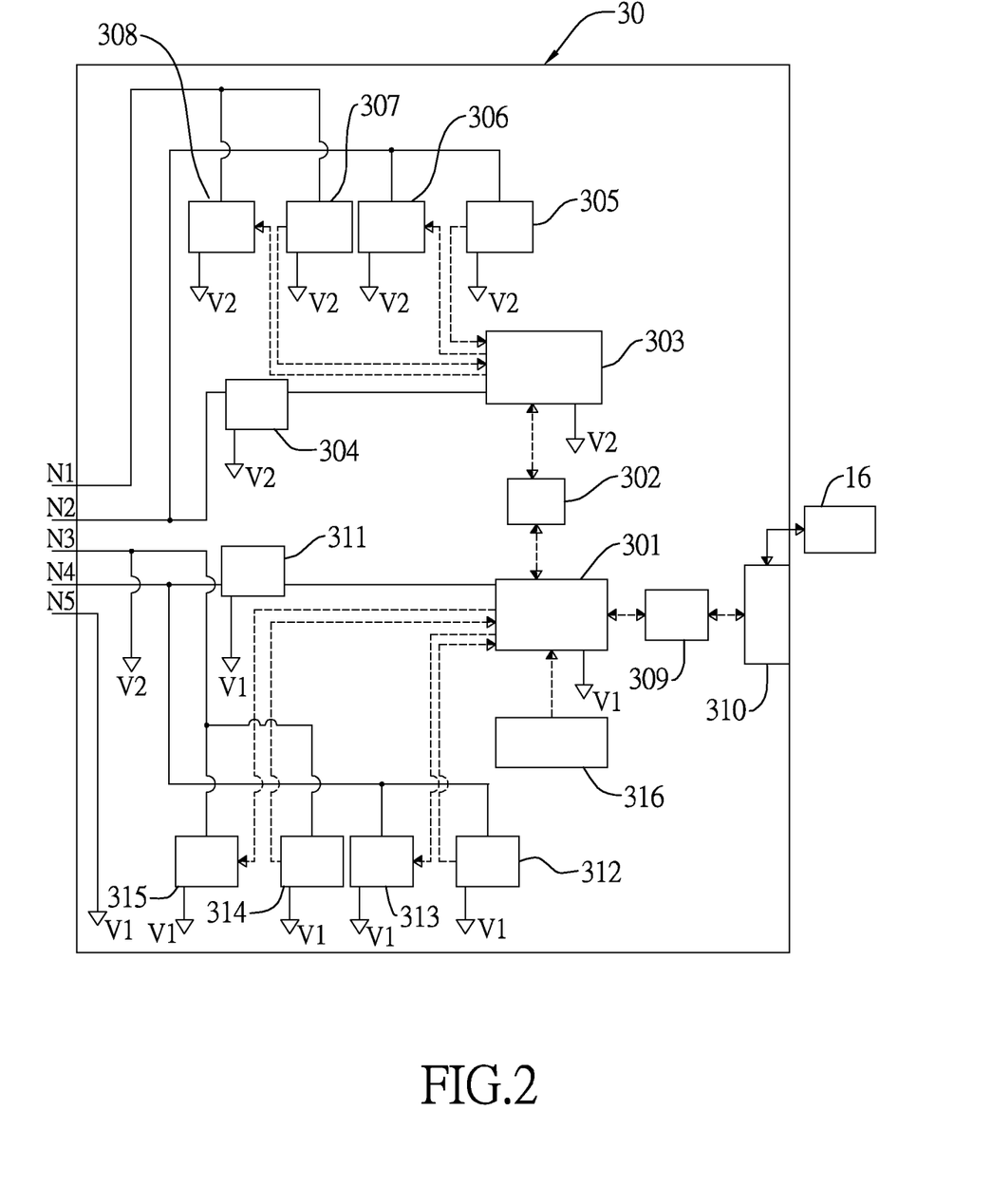
FIG. 2 is a functional block diagram of an internal resistance sensor assembly of the UPS in FIG. 1.

With reference to FIGS. 1 and 2, a first embodiment of an un-interruptible power supply (UPS) with indication of battery internal resistance in accordance with the present invention includes an AC (Alternating Current) power input port 11, a battery charger 12, a DC (Direct Current) to AC converter 13, a switch 14, an AC power output port 15, a processor 16, a display 17, a battery pack and an internal resistance sensor assembly. In the present embodiment, a surge suppressor 18 and a filter 19 are also included. The battery pack and the internal resistance sensor assembly may be installed in a separate housing without the AC power input port 11, the battery charger 12, the DC to AC converter 13, the switch 14, the AC power output port 15, the processor 16, the display 17 or in a same housing along with the AC power input port 11, the battery charger 12, the DC to AC converter 13, the switch 14, the AC power output port 15, the processor 16, the display 17.

An input terminal of the battery charger 12 is connected to the AC power input port 11, and an output terminal of the battery charger 12 is connected to an input terminal of the DC to AC converter 13 and the battery pack. The battery charger 12 receives AC power from the AC power input port 11 and converts the AC power into DC power to charge the battery pack.

An input terminal of the surge suppressor 18 is connected to the AC power input port 11, and an output terminal of the surge suppressor 18 is connected to an input terminal of the filter 19. The surge suppressor 18 serves to suppress voltage spikes in the AC power. The filter 19 serves to filters noises in the AC power.

The switch 14 has a first end 141, a second end 142 and a switching end 143. The first end 141 is connected to an output terminal of the filter 19. The second end 142 is connected to an output terminal of the DC to AC converter 13. The switching end 143 is connected to the AC power output port 15.

The processor 16 has multiple input terminals and multiple output terminals. The multiple output terminals of the processor 16 are connected to the switch 14 and the display 17. The multiple input terminals of the processor 16 are connected to the AC power input port 11. The processor 16 is communicatively connected to the internal resistance sensor assembly to receive signals transmitted from the internal resistance sensor assembly or transmit signals to the internal resistance sensor assembly.

In the present embodiment, the battery pack has multiple batteries connected in series to each other, which include a first battery 21, a second battery 22, a third battery 23 and a fourth battery 24. A positive terminal of the first battery 21 is connected to the input terminal of the DC to AC converter 13. The number and type of battery of the battery pack may be selected based on actual demand of the user.

The AC power input port 11 is connected to mains power. When acquiring an AC-sensed signal from the AC power input port, the processor 16 controls the switching end 143 of the switch 14 to be connected with the first end 141, such that the mains power directly supplies power to an external electronic device connected to the AC power output port 15. When acquiring no AC-sensed signal, the processor 16 controls the switching end 143 of the switch 14 to be connected with the second end 142, such that the battery pack supplies power to the AC power output port 15 through the DC to AC converter 13 for supplying the external electronic device.

In the present embodiment, the internal resistance sensor assembly includes a sensor 30. The number of sensor of the internal resistance sensor assembly may be selected based on actual demand of the user.

The sensor 30 includes a first microcontroller unit (MCU) 301, a first isolation unit 302, a second MCU 303, a first DC to DC conversion unit 304, a first internal resistance measuring unit 305, a first internal resistance measurement driving unit 306, a second internal resistance measuring unit 307, a second internal resistance measurement driving unit 308, a second isolation unit 309, a communication interface port 310, a second DC to DC conversion unit 311, a third internal resistance measuring unit 312, a third internal resistance measurement driving unit 313, a fourth internal resistance measuring unit 314, a fourth internal resistance measurement driving unit 315 and a temperature sensing unit 316.

The first MCU 301 has multiple input terminals and multiple output terminals. The first MCU 301 is connected to the first isolation unit 302 and the second isolation unit 309 by way of two-way connection. In other words, one input terminal and one output terminal of the first MCU 301 are respectively connected to an input terminal and an output terminal of the first isolation unit 302, and another input terminal and another output terminal of the first MCU 301 are respectively connected to an input terminal and an output terminal of the second isolation unit 309. The remaining input terminals of the first MCU 301 are respectively connected to an output terminal of the second DC to DC conversion unit 311, an output terminal of the third internal resistance measuring unit 312, an output terminal of the fourth internal resistance measuring unit 314, and an output terminal of the temperature sensing unit 316. The remaining output terminals of the first MCU 301 are respectively connected to an input terminal of the third internal resistance measurement driving unit 313 and an input terminal of the fourth internal resistance measurement driving unit 315. The second isolation unit 309 is connected to the communication interface port 310 by way of two-way connection. In other words, another input terminal and another output terminal of the second isolation unit 309 are respectively connected to an input terminal and an output terminal of the communication interface port 310. The communication interface port 310 is communicatively connected to the processor 16.

The second MCU 303 includes multiple input terminals and multiple output terminals. The second MCU 303 is connected to the first isolation unit 302 by way of two-way connection. In other words, one input terminal and one output terminal of the second MCU 303 are respectively connected to an input terminal and an output terminal of the first isolation unit 302. The remaining input terminals of the second MCU 303 are respectively connected to an output terminal of the first DC to DC conversion unit 304, an output terminal of the first internal resistance measuring unit 305, and an output terminal of the second internal resistance measuring unit 307. The remaining output terminals of the second MCU 303 are respectively connected to an input terminal of the first internal resistance measurement driving unit 306 and an input terminal of the second internal resistance measurement driving unit 308.

The first isolation unit 302 is provided for the disconnected first MCU 301 and second MCU 303 to exchange signals. The second isolation unit 309 is provided for the disconnected first MCU 301 and communication interface port 310 to exchange signals.

The temperature sensing unit 316 simultaneously senses current temperature when the sensor 30 senses an internal resistance of the battery pack, and transmits the sensed temperature to the first MCU 301.

The first DC to DC conversion unit 304 and the second DC to DC conversion unit 311 are used to convert voltage of the battery pack to an operating voltage for the second MCU 303 and the first MCU 301 respectively.

An input terminal of the second internal resistance measuring unit 307 is connected to an output terminal of the second internal resistance measurement driving unit 308 to constitute a first connection point N1, which is further connected to a positive terminal of the first battery 21.

An input terminal of the first internal resistance measuring unit 305, an output terminal of the first internal resistance measurement driving unit 306, and an input terminal of the first DC to DC conversion unit 304 are connected to constitute a second connection point N2, which is further connected to a positive terminal of the second battery 22.

An input terminal of the fourth internal resistance measuring unit 314 and an output terminal of the fourth internal resistance measurement driving unit 315 are connected to constitute a third connection point N3, which is further connected to a positive terminal of the third battery 23.

An input terminal of the third internal resistance measuring unit 312, an output terminal of the third internal resistance measurement driving unit 313, and an output terminal of the second DC to DC conversion unit 311 are connected to constitute a fourth connection point N4, which is further connected to a positive terminal of the fourth battery 24.

A negative terminal of the fourth battery 24 is connected to a fifth connection point N5, which is extended out as a first reference voltage V1.

A negative terminal of the second battery 22 and the positive terminal of the third battery 23 are connected to the second connection point N2, which is extended out as a second reference voltage V2 different from the first reference voltage V1.

When measuring the internal resistance of the battery pack, the processor 16 issues a command signal to the first MCU 301 and the second MCU 303 through the communication interface port 310. The second MCU 303 controls the second internal resistance measurement driving unit 308 to send a driving signal to drive the first battery 21 and the second battery 22 to operate, such that the second internal resistance measuring unit 307 transmits a first measurement signal generated by the operation of the first battery 21 and the second battery 22 to the second MCU 303.

The second MCU 303 controls the first internal resistance measurement driving unit 306 to send the driving signal to the second battery 22 to drive the second battery 22 to operate, such that the first internal resistance measuring unit 305 transmits a second measurement signal generated by the operation of the second battery 22 to the second MCU 303.

The second MCU 303 transmits the first measurement signal and the second measurement signal to the first MCU 301 for processing. Alternatively, the second MCU 303 transmits a first internal resistance of the first battery 21 generated according to a difference between a resistance value converted from the first measurement signal and a resistance value converted from the second measurement signal and then a second internal resistance of the second battery 22 generated according to a resistance value converted from the second measurement signal to the first MCU 301.

The first MCU 301 controls the fourth internal resistance measurement driving unit 315 to send the driving signal to drive the third battery 23 and the fourth battery 24 to operate, such that the fourth internal resistance measuring unit 314 transmits a third measurement signal generated by the operation of the third battery 23 and the fourth battery 24 to the first MCU 301.

The first MCU 301 controls the third internal resistance measurement driving unit 313 to send the driving signal to the fourth battery 24 to drive the fourth battery 24 to operate, such that the third internal resistance measurement driving unit 313 transmits a fourth measurement signal generated by the operation of the fourth battery 24 to the first MCU 301.

The first MCU 301 generates a third internal resistance of the third battery 23 according to a difference between a resistance value converted from the third measurement signal and a resistance value converted from the fourth measurement signal and a fourth internal resistance of the fourth battery 24 generated according to a resistance value converted from the fourth measurement signal.

The first MCU 301 directly calculates the first internal resistance, the second internal resistance, the third internal resistance and the fourth internal resistance, or the first MCU 301 transmits the first measurement signal, the second measurement signal, the third measurement signal and the fourth measurement signal to the processor 16 through the communication interface port 310 for calculation.

The first MCU 301 transmits a temperature sensed by the temperature sensing unit 316 corresponding to the first internal resistance, the second internal resistance, the third internal resistance and the fourth internal resistance to the processor 16.

Figure 3:
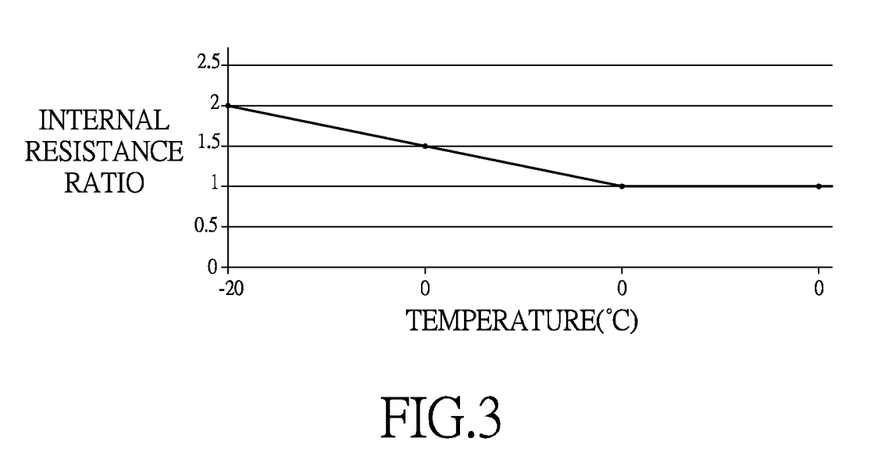
FIG. 3 is a chart showing relationship between internal temperature ratio and temperature of the UPS in FIG. 1.

As the surrounding temperature of the battery pack will affect the internal resistance measured by the sensor 30, for example, the internal resistance of battery drops when the surrounding temperature rises, and the internal resistance of battery rises when the surrounding temperature drops, with reference to FIG. 3, the processor 16 is further built in with compensation ratio information expressed by a relationship between the surrounding temperature and internal resistance ratio beforehand.

The processor 16 acquires the first internal resistance, the second internal resistance, the third internal resistance, the fourth internal resistance and corresponding surrounding temperatures, then finds the internal resistance ratios corresponding to the surrounding temperatures, and divides the first internal resistance, the second internal resistance, the third internal resistance and the fourth internal resistance by their corresponding internal resistance ratios to respectively generate a first compensated internal resistance, a second compensated internal resistance, a third compensated internal resistance and a fourth compensated internal resistance.

Given a first example, when the measured first internal resistance is 25 mΩ (milliohm) and a corresponding surrounding temperature is 25° C., the internal resistance ratio corresponding to the surrounding temperature 25° C. is 1. The first internal resistance 25 mΩ is divided by the corresponding internal resistance ratio 1 to generate a first compensated internal resistance 25 mΩ.

Given a second example, when the measured first internal resistance is 37.5 mΩ and a corresponding surrounding temperature is 0° C., as can be found in the compensation ratio information, the internal resistance ratio corresponding to the surrounding temperature 0° C. is 1.5. The first internal resistance 37.5 mΩ is divided by the corresponding internal resistance ratio 1.5 to generate a first compensated internal resistance 25 mΩ.

Given a third example, when the measured first internal resistance is 50 mΩ and a corresponding surrounding temperature is −20° C., as can be found in the compensation ratio information, the internal resistance ratio corresponding to the surrounding temperature −20° C. is 2. The first internal resistance 50 mΩ is divided by the corresponding internal resistance ratio 2 to generate a first compensated internal resistance 25 mΩ.

Given a fourth example, when the measured first internal resistance is 24.75 mΩ and a corresponding surrounding temperature is 60° C., as can be found in the compensation ratio information, the internal resistance ratio corresponding to the surrounding temperature 60° C. is 0.99. The first internal resistance 24.75 mΩ is divided by the corresponding internal resistance ratio 0.99 to generate a first compensated internal resistance 25 mΩ.

As the effect of the surrounding temperature on the internal resistance can be compensated with the compensation ratio information, the accuracy in determining the internal resistance can be enhanced. The compensation ratio information built in beforehand may vary with the type of batteries in the battery pack.

As the battery pack becomes stable after operation for a period of time, the sensor 30 continuously detects the internal resistance of the battery pack within a stable time after installation to acquire each of the first internal resistance, the second internal resistance, the third internal resistance and the fourth internal resistance multiple times, and takes an average of each of the multiple first internal resistances, the multiple second internal resistances, the multiple third internal resistances and the multiple fourth internal resistances to generate a first reference internal resistance, a second reference internal resistance, a third reference internal resistance and a fourth reference internal resistance with higher reliability as the basis of determining status of the internal resistance of each battery. The processor 16 displays the first to fourth reference internal resistances through the display 17.

The stable time after installation for battery may be 3~4 months, 4~5 months or 5~6 months. Depending on type of the batteries in the battery pack and installation environment of the batteries, the stable time after installation for battery may vary case by case. Thus, the stable time after installation can be configured according to actual batteries in use and the installation environment.

When the battery pack turns to be stable or the stable time after installation expires, the processor 16 instructs the sensor 30 to sense the internal resistance of each of the first battery 21, the second battery 22, the third battery 23 and the fourth battery 24 after the battery pack is stable, and generates a first stable internal resistance, a second stable internal resistance, a third stable internal resistance, and a fourth stable internal resistance, which are respectively compared with the first reference internal resistance, the second reference internal resistance, the third reference internal resistance, and the fourth reference internal resistance to generate corresponding internal resistance statuses to be displayed through the display 17.

Given the first internal resistance acquired after the stable time for explanation, the first stable internal resistance acquired after the stable time is divided by the first reference internal resistance to generate a computed value and determines if the computed value falls within a predetermined range built in the processor 16. It indicates that the status of the internal resistance of the first battery 21 is bad when the computed value falls within a first range, is to be observed when the computed value falls within a second range, and is normal when the computed value falls within a third range. In the present embodiment, the first range, the second range and the third range are respectively defined by a range greater than 200% (computed value>200%), a range between 150% and 200% (150%<computed value≤200%), and a range less than 150% (computed value≤150%).

The way of determining the status of each of the second stable internal resistance, the third stable internal resistance, and the fourth stable internal resistance is identical to that of determining the status of the first stable internal resistance.

The display 17 may be a display displaying status of internal resistance of the battery with texts. When the computed value falls within the first range, the display 17 indicates the bad status of internal resistance of the battery with texts such as "Alarm". When the computed value falls within the second range, the display 17 indicates the status to be observed of internal resistance with texts such as "Warning". When the computed value falls within the third range, the display 17 indicates the normal status of internal resistance with texts such as "Normal".

The display 17 may be a display displaying status of internal resistance of battery with a background color of a screen of the display. When the computed value falls within the first range, the display 17 indicates the bad status of internal resistance with a red background color. When the computed value falls within the second range, the display 17 indicates the status to be observed of internal resistance with an orange background color. When the computed value falls within the third range, the display 17 indicates the normal status of internal resistance with a green background color. The choices of the background colors include but are not limited to the foregoing examples.

As the status of internal resistance of battery can be indicated by texts or background colors, when the performance of the battery pack deteriorates, the issue of the battery pack can be promptly tackled.

Figure 4:
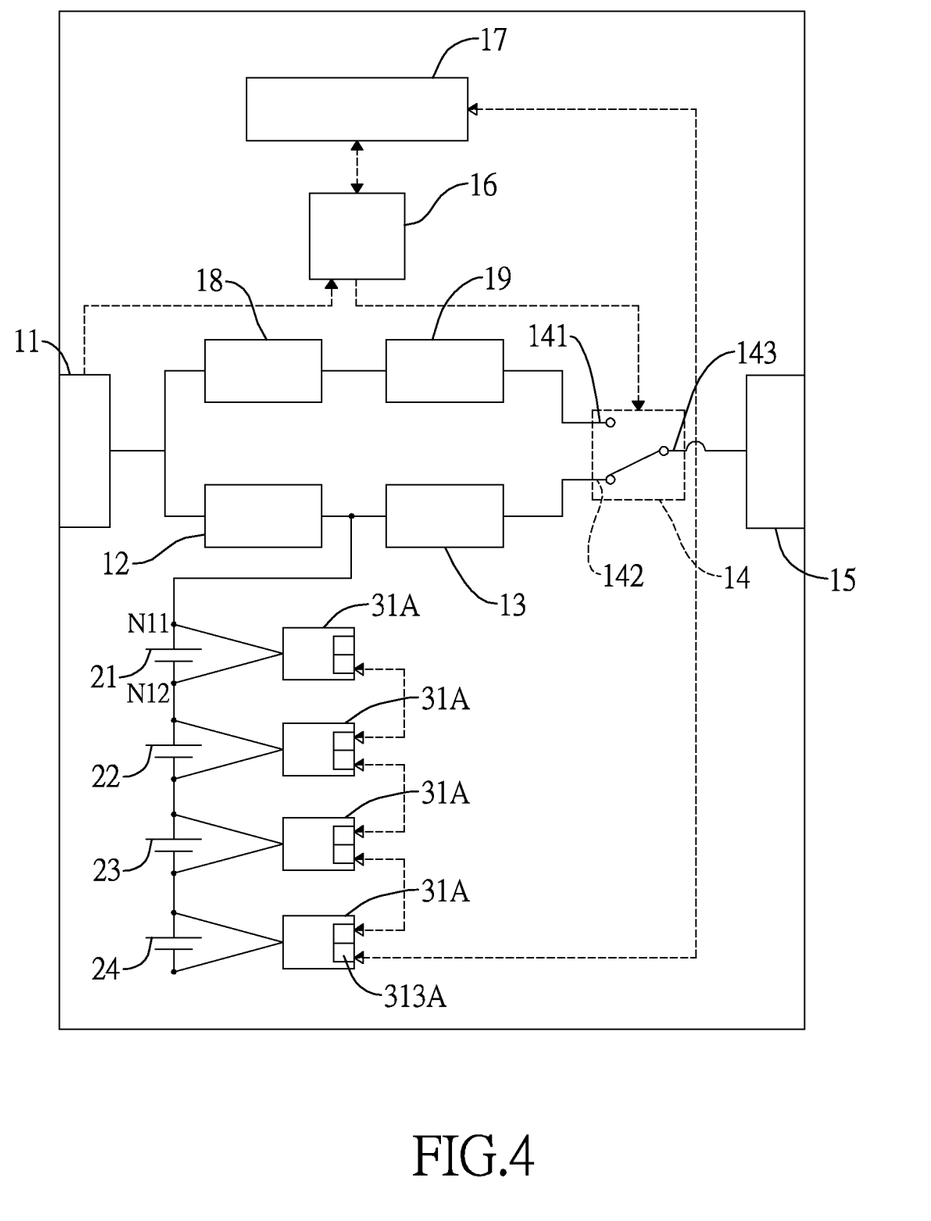
FIG. 4 is a functional block diagram of a second embodiment of a UPS with indication of battery internal resistance in accordance with the present invention.
Figure 5:
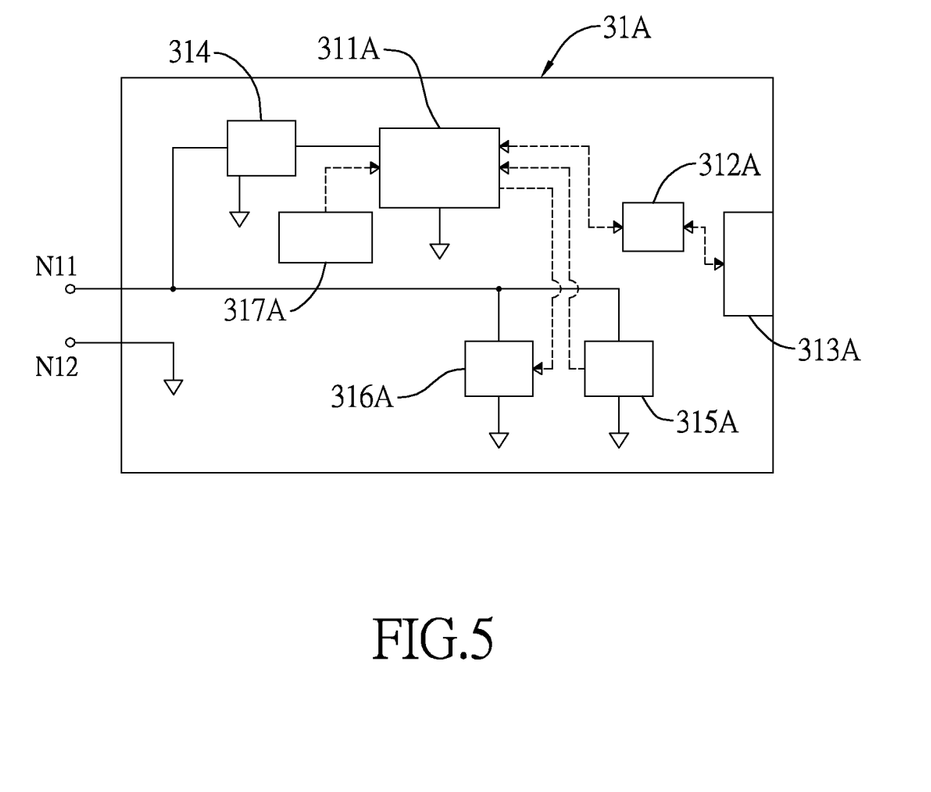
FIG. 5 is a functional block diagram of an internal resistance sensor assembly of the UPS in FIG. 4.

With reference to FIGS. 4 and 5, a second embodiment of a UPS with indication of battery internal resistance in accordance with the present invention differs from the foregoing embodiment in the internal resistance sensor assembly.

In the present embodiment, the internal resistance sensor assembly includes multiple sensors 31A. The multiple sensors 31A include a first sensor 31A corresponding to the first battery 21 for measuring the internal resistance of the first battery 21, a second sensor 31A corresponding to the second battery 22 for measuring the internal resistance of the second battery 22, a third sensor 31A corresponding to the third battery 21 for measuring the internal resistance of the third battery 23, and a fourth sensor 31A corresponding to the fourth battery 24 for measuring the internal resistance of the fourth battery 24.

Each sensor 31A includes a microprocessor 311A, an isolation unit 312A, a communication interface port 313A, a DC to DC conversion unit 314A, an internal resistance measuring unit 315A, an internal resistance measurement driving unit 316A, and a temperature sensing unit 317A.

The microprocessor 311A has multiple input terminals and multiple output terminals. One input terminal and one output terminal of the microprocessor 311A are respectively connected to an input terminal and an output terminal of the isolation unit 312A by two-way connection. The remaining input terminals of the microprocessor 311A are connected to the DC to DC conversion unit 314A, the internal resistance measuring unit 315A and the temperature sensing unit 317A, and the remaining output terminals of the microprocessor 311A are connected to the internal resistance measurement driving unit 316A. The isolation unit 312a is connected to the communication interface port 313A by two-way connection. The communication interface port 313A is communicatively connected to the processor 16.

In the present embodiment, the communication interface ports 313A of the multiple sensors 31A are sequentially connected in series to each other with a final sensor 31A transmitting signals to the processor 16.

In the present embodiment, the DC to DC conversion unit 314A, the internal resistance measuring unit 315A and the internal resistance measurement driving unit 316A are connected to constitute a first connection point N11, which is connected to a positive terminal of a corresponding battery. Each sensor 31A has a reference voltage terminal with a second connection point N21 connected to a negative terminal of the corresponding battery.

During the stable time after installation, the multiple sensors 31A measure the internal resistances of the respective batteries and transmit the internal resistances to the processor 16 for computation to generate the reference internal resistances. After the stable time expires and the battery pack is getting stable, the processor 16 receives the internal resistances sensed by the multiple sensors 31A to generate the corresponding stable internal resistances, and compares the stable internal resistances with the reference internal resistances to generate corresponding statuses of internal resistance of the batteries to be displayed by the display 17 for users to have timely awareness of the status of internal resistance of the battery pack.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An un-interruptible power supply (UPS) with indication of battery internal resistance, comprising:
    an AC (Alternating Current) power input port adapted to connect to an AC power source;
    a battery charger connected to the AC power input port;
    a DC (Direct Current) to AC converter connected to the battery charger;
    a switch having:
        a first end connected to the AC power input port;
        a second end connected to the DC to AC converter; and
        a switching end switched by the switch to connect to one of the first end and the second end according to a control command received by the switch;
    a processor having multiple input terminals and multiple output terminals, and transmitting the control command to the switch when receiving an AC-sensed signal, wherein a part of the multiple output terminals of the processor are connected to the switch, and a part of the multiple input terminals of the processor are connected to the AC power input port;
    a display connected to one of the output terminals of the processor and displaying text-based information;
    a battery pack connected to the battery charger and the DC to AC converter, supplying a DC power, and charged by the battery charger;
    an internal resistance sensor assembly connected to the battery pack and the processor to sense an internal resistance of the battery pack and transmit the internal resistance to the processor;
    wherein the processor generates a reference internal resistance according to multiple internal resistances of the battery pack detected within a stable time after installation of the battery pack, generates a stable internal resistance when an internal resistance is detected by the internal resistance sensor assembly after the stable time expires, and compares the stable internal resistance with the reference internal resistance to generate an internal resistance status for the display to display a status of internal resistance of the battery pack.

2. The UPS as claimed in claim 1, wherein the processor takes an average of the multiple internal resistances of the battery pack to generate the reference internal resistance.

3. The UPS as claimed in claim 2, wherein the processor divides the stable internal resistance generated after the stable time by the reference internal resistance to generate a computed value, determines that a status of the internal resistance of the battery pack is bad when the computed value falls within a first range, is to be observed when the computed value falls within a second range, and is normal when the computed value falls within a third range.

4. The UPS as claimed in claim 3, wherein the first range, the second range and the third range are respectively defined by a range greater than 200%, a range greater than 150% and less than or equal to 200%, and a range less than or equal to 150%.

5. The UPS as claimed in claim 4, wherein the display prompts the status of internal resistance of the battery pack in an alarm state when the computed value falls within the first range, in a warning state when the computed value falls within the second range, and in a normal state when the computed value falls within the third range.

6. The UPS as claimed in claim 5, wherein the stable time after installation ranges from 3 to 6 months.

7. The UPS as claimed in claim 6, wherein
    when detecting the multiple internal resistances of the battery set before the stable time expires or detecting the stable internal resistance after the stable time expires, the internal resistance sensor assembly simultaneously detects a surrounding temperature and transmits the multiple internal resistances or the stable internal resistance and the surrounding temperature to the processor; and the processor is built in with compensation ratio information expressed by a relationship between the surrounding temperature and an internal resistance ratio, and finds the internal resistance ratio corresponding to the surrounding temperature, and divides each of the multiple internal resistances or the stable internal resistance of the battery pack by the corresponding internal resistance ratio to generate a compensated internal resistance.

8. The UPS as claimed in claim 7, wherein
the battery pack has multiple batteries connected in series to each other and including a first battery, a second battery, a third battery and a fourth battery;
the internal resistance sensor assembly includes a sensor, the sensor includes:
a first internal resistance measuring unit and a first internal resistance measurement driving unit connected to a positive terminal of the second battery;
a second internal resistance measuring unit and a second internal resistance measurement driving unit connected to a positive terminal of the first battery;
a third internal resistance measuring unit and a third internal resistance measurement driving unit connected to a positive terminal of the fourth battery;
a fourth internal resistance measuring unit and a fourth internal resistance measurement driving unit connected to a positive terminal of the third battery;
a first isolation unit and a second isolation unit, wherein the second isolation unit is connected to the communication interface port, wherein the communication interface port is connected to the processor;
a first microcontroller unit (MCU) connected to the first isolation unit, the second isolation unit, the third internal resistance measuring unit, the third internal resistance measurement driving unit, the fourth internal resistance measuring unit and the fourth internal resistance measurement driving unit; and
a second MCU connected to the first isolation unit, the first internal resistance measuring unit, the first internal resistance measurement driving unit, the second internal resistance measuring unit, the second internal resistance measurement driving unit.

9. The UPS as claimed in claim 8, wherein the processor transmits a command signal to the first MCU and the second MCU, the second MCU controls the second internal resistance measurement driving unit to instruct the first battery and the second battery to operate, the second internal resistance measuring unit transmits a first measurement signal to the second MCU, the second MCU controls the first internal resistance measurement driving unit to instruct the second battery to operate, the first internal resistance measuring unit transmits a second measurement signal to the second MCU, the second MCU transmits a first internal resistance and a second internal resistance to the first MCU according to the first measurement signal and the second measurement signal, the first MCU controls the fourth internal resistance measurement driving unit to instruct the third battery and the fourth battery to operate, the fourth internal resistance measuring unit transmits a third measurement signal to the first MCU, the first MCU controls the third internal resistance measurement driving unit to instruct the fourth battery to operate, the third internal resistance measuring unit transmits a fourth measurement signal to the first MCU, the first MCU transmits a third internal resistance and a fourth internal resistance to the processor according to the third measurement signal and the fourth measurement signal and transmits the first internal resistance and the second internal resistance to the processor, and the processor respectively generates a first compensated internal resistance, a second compensated internal resistance, a third compensated internal resistance and a fourth compensated internal resistance corresponding to the first battery, the second battery, the third battery and the fourth battery according to the first internal resistance, the second internal resistance, the third internal resistance, and the fourth internal resistance.

10. The UPS as claimed in claim 7, wherein
the internal resistance sensor assembly has multiple sensors and each sensor has a microprocessor, an isolation unit, a communication interface port, an internal resistance measuring unit, and an internal resistance measurement driving unit, wherein the microprocessor is connected to the isolation unit, the internal resistance measuring unit and the internal resistance measurement driving unit, the communication interface port is connected to the isolation unit, the communication interface ports of the multiple sensors are connected in series and then are connected to the processor; and
the battery pack has multiple batteries connected in series to each other, the internal resistance measuring unit and the internal resistance measurement driving unit of each sensor are connected to the positive terminal of a corresponding battery, wherein the processor transmits a command signal to the microprocessor of each sensor, the microprocessor controls the internal resistance measurement driving unit to instruct a corresponding battery to operate, and the internal resistance measuring unit of the sensor transmits a measurement signal of the corresponding battery to the processor for computation to generate a status of internal resistance of the corresponding battery.

11. An un-interruptible power supply (UPS) with indication of battery internal resistance, comprising:
an AC (Alternating Current) power input port adapted to connect to an AC power source;
a battery charger connected to the AC power input port;
a DC (Direct Current) to AC converter connected to the battery charger;
a switch having:
a first end connected to the AC power input port;
a second end connected to the DC to AC converter; and
a switching end switched by the switch to connect to one of the first end and the second end according to a control command received by the switch;
an AC power output port connected to the switching end of the switch and adapted to connect to an external electronic device to supply power to the electronic device;
a processor having multiple input terminals and multiple output terminals, and transmitting the control command to the switch when receiving an AC-sensed signal, wherein a part of the multiple output terminals of the processor are connected to the switch, and a part of the multiple input terminals of the processor are connected to the AC power input port;
a display connected to one of the output terminals of the processor;
a battery pack connected to the battery charger and the DC to AC converter, supplying a DC power, and charged by the battery charger;
an internal resistance sensor assembly connected to the battery pack and the processor to sense an internal resistance of the battery pack and transmit the internal resistance to the processor;

wherein the processor generates a reference internal resistance according to multiple internal resistances of the battery pack detected within a stable time after installation of the battery pack, generates a stable internal resistance when an internal resistance is detected by the internal resistance sensor assembly after the stable time expires, and compares the stable internal resistance with the reference internal resistance to generate an internal resistance status for the display to display the internal resistance status with a corresponding background color of a screen of the display.

12. The UPS as claimed in claim 11, wherein the processor takes an average of the multiple internal resistances of the battery pack to generate the reference internal resistance.

13. The UPS as claimed in claim 12, wherein the processor divides the stable internal resistance generated after the stable time by the reference internal resistance to generate a computed value, determines that a status of the internal resistance of the battery pack is bad when the computed value falls within a first range, is to be observed when the computed value falls within a second range, and is normal when the computed value falls within a third range.

14. The UPS as claimed in claim 13, wherein the first range, the second range and the third range are respectively defined by a range greater than 200%, a range greater than 150% and less than or equal to 200%, and a range less than or equal to 150%.

15. The UPS as claimed in claim 14, wherein the display prompts the status of internal resistance of the battery pack in an alarm state when the computed value falls within the first range, in a warning state when the computed value falls within the second range, and in a normal state when the computed value falls within the third range.

16. The UPS as claimed in claim 15, wherein the stable time after installation ranges from 3 to 6 months.

17. The UPS as claimed in claim 16, wherein
when detecting the multiple internal resistances of the battery set before the stable time expires or detects the stable internal resistance after the stable time expires, the internal resistance sensor assembly simultaneously detects a surrounding temperature and transmits the multiple internal resistances or the stable internal resistance of the battery pack and the surrounding temperature to the processor; and
the processor is built in with compensation ratio information expressed by a relationship between the surrounding temperature and an internal resistance ratio, and finds the internal resistance ratio corresponding to the detected surrounding temperature, and divides the each of the multiple internal resistances or the stable internal resistance of the battery pack by the corresponding internal resistance ratio to generate the compensated internal resistance.

18. The UPS as claimed in claim 17, wherein
the battery pack has multiple batteries connected in series to each other and including a first battery, a second battery, a third battery and a fourth battery;
the internal resistance sensor assembly includes a sensor, the sensor includes:
a first internal resistance measuring unit and a first internal resistance measurement driving unit connected to a positive terminal of the second battery;
a second internal resistance measuring unit and a second internal resistance measurement driving unit connected to a positive terminal of the first battery;
a third internal resistance measuring unit and a third internal resistance measurement driving unit connected to a positive terminal of the fourth battery;
a fourth internal resistance measuring unit and a fourth internal resistance measurement driving unit connected to a positive terminal of the third battery;
a first isolation unit and a second isolation unit, wherein the second isolation unit is connected to the communication interface port, wherein the communication interface port is connected to the processor;
a first microcontroller unit (MCU) connected to the first isolation unit, the second isolation unit, the third internal resistance measuring unit, the third internal resistance measurement driving unit, the fourth internal resistance measuring unit and the fourth internal resistance measurement driving unit; and
a second MCU connected to the first isolation unit, the first internal resistance measuring unit, the first internal resistance measurement driving unit, the second internal resistance measuring unit, the second internal resistance measurement driving unit.

19. The UPS as claimed in claim 18, wherein the processor transmits a command signal to the first MCU and the second MCU, the second MCU controls the second internal resistance measurement driving unit to instruct the first battery and the second battery to operate, the second internal resistance measuring unit transmits a first measurement signal to the second MCU, the second MCU controls the first internal resistance measurement driving unit to instruct the second battery to operate, the first internal resistance measuring unit transmits a second measurement signal to the second MCU, the second MCU transmits a first internal resistance and a second internal resistance to the first MCU according to the first measurement signal and the second measurement signal, the first MCU controls the fourth internal resistance measurement driving unit to instruct the third battery and the fourth battery to operate, the fourth internal resistance measuring unit transmits a third measurement signal to the first MCU, the first MCU controls the third internal resistance measurement driving unit to instruct the fourth battery to operate, the third internal resistance measuring unit transmits a fourth measurement signal to the first MCU, the first MCU transmits a third internal resistance and a fourth internal resistance to the processor according to the third measurement signal and the fourth measurement signal, and the processor respectively generates a first compensated internal resistance, a second compensated internal resistance, a third compensated internal resistance and a fourth compensated internal resistance corresponding to the first battery, the second battery, the third battery and the fourth battery according to the first internal resistance, the second internal resistance, the third internal resistance, and the fourth internal resistance.

20. The UPS as claimed in claim 17, wherein
the internal resistance sensor assembly has multiple sensors and each sensor has a microprocessor, an isolation unit, a communication interface port, an internal resistance measuring unit, and an internal resistance measurement driving unit, wherein the microprocessor is connected to the isolation unit, the internal resistance measuring unit and the internal resistance measurement driving unit, the communication interface port is connected to the isolation unit, the communication interface ports of the multiple sensors are connected in series and then are connected to the processor; and
the battery pack has multiple batteries connected in series to each other, the internal resistance measuring unit and the internal resistance measurement driving unit of each sensor are connected to the positive terminal of a corresponding battery, wherein the processor transmits a command signal to the microprocessor of each sensor, the microprocessor controls the internal resistance measurement driving unit to instruct a corresponding battery to operate, and the internal resistance measuring unit of the sensor transmits a measurement signal of the corresponding battery to the processor for computation to generate a status of internal resistance of the corresponding battery.

* * * * *